United States Patent
Burak et al.

(10) Patent No.: US 9,525,399 B2
(45) Date of Patent: Dec. 20, 2016

(54) PLANARIZED ELECTRODE FOR IMPROVED PERFORMANCE IN BULK ACOUSTIC RESONATORS

(75) Inventors: Dariusz Burak, Fort Collins, CO (US); Phil Nikkel, Loveland, CO (US); John Choy, Westminster, CO (US); Alexandre Shirakawa, San Jose, CA (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 828 days.

(21) Appl. No.: 13/286,038

(22) Filed: Oct. 31, 2011

(65) Prior Publication Data

US 2013/0106534 A1 May 2, 2013

(51) Int. Cl.
H03H 9/15 (2006.01)
H03H 9/17 (2006.01)
H03H 3/02 (2006.01)

(52) U.S. Cl.
CPC ..................... *H03H 9/173* (2013.01)

(58) Field of Classification Search
CPC .............. H03H 9/00; H03H 9/02; H01L 41/04
USPC .................. 333/187, 188, 189, 191; 310/320
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,060,818 A | 5/2000 | Ruby et al. | |
| 6,107,721 A | 8/2000 | Lakin | |
| 6,507,983 B1 | 1/2003 | Ruby et al. | |
| 6,816,035 B2* | 11/2004 | Ma et al. ........................ | 333/187 |
| 6,954,121 B2* | 10/2005 | Bradley et al. ................ | 333/187 |
| 7,116,034 B2* | 10/2006 | Wang et al. .................... | 333/187 |
| 7,212,082 B2* | 5/2007 | Nagao .................... | H01L 41/316 310/324 |
| 7,259,498 B2* | 8/2007 | Nakatsuka et al. ........... | 310/324 |
| 7,280,007 B2 | 10/2007 | Feng et al. | |
| 7,299,529 B2* | 11/2007 | Ginsburg et al. ............ | 29/25.35 |
| 7,388,454 B2 | 6/2008 | Ruby et al. | |
| 7,408,429 B2 | 8/2008 | Iwasaki et al. ................ | 333/191 |
| 7,435,613 B2* | 10/2008 | Barber .................... | H03H 3/007 438/53 |
| 7,468,608 B2* | 12/2008 | Feucht et al. ................. | 324/633 |
| 7,629,865 B2 | 12/2009 | Ruby | |
| 7,791,434 B2 | 9/2010 | Fazzio et al. | |
| 7,889,024 B2 | 2/2011 | Bradley et al. | |
| 7,939,987 B1 | 5/2011 | Solal et al. | |
| 7,939,990 B2 | 5/2011 | Wang et al. | |
| 7,978,025 B2* | 7/2011 | Yokoyama et al. .......... | 333/133 |
| 8,330,325 B1* | 12/2012 | Burak et al. .................. | 310/320 |
| 8,350,445 B1* | 1/2013 | Shirakawa et al. ........... | 310/320 |
| 8,796,904 B2* | 8/2014 | Burak et al. .................. | 310/320 |

(Continued)

OTHER PUBLICATIONS

Co-pending U.S. Appl. No. 13/074,094, filed Mar. 29, 2011.

(Continued)

*Primary Examiner* — Dean Takaoka (57) ABSTRACT

In a representative embodiment, a bulk acoustic wave (BAW) resonator, comprises: a cavity disposed in a substrate; a first electrode disposed over the cavity; a planarization layer disposed adjacent to the first electrode; a piezoelectric layer disposed over the first electrode; and a second electrode disposed over the piezoelectric layer.

16 Claims, 8 Drawing Sheets

(56) References Cited

U.S. PATENT DOCUMENTS

| | | | |
|---|---|---|---|
| 8,797,123 B2 * | 8/2014 | Burak et al. | 333/187 |
| 2007/0205850 A1 | 9/2007 | Jamneala et al. | |
| 2009/0127978 A1 | 5/2009 | Asai et al. | |
| 2010/0327697 A1 | 12/2010 | Choy et al. | |
| 2010/0327994 A1 | 12/2010 | Choy et al. | |
| 2011/0204997 A1 | 8/2011 | Elbrecht et al. | |

OTHER PUBLICATIONS

Co-pending U.S. Appl. No. 13/036,489, filed Feb. 28, 2011.
Co-pending U.S. Appl. No. 13/101,376, filed May 5, 2011.
Co-pending U.S. Appl. No. 13/074,262, filed Mar. 29, 2011.
Co-pending U.S. Appl. No. 13/161,946, filed Jun. 16, 2011.
Co-pending U.S. Appl. No. 13/232,213, filed Sep. 14, 2011.

* cited by examiner

PLANARIZED ELECTRODE FOR IMPROVED PERFORMANCE IN BULK ACOUSTIC RESONATORS

BACKGROUND

Transducers generally convert electrical signals to mechanical signals or vibrations, and/or mechanical signals or vibrations to electrical signals. Acoustic transducers, in particular, convert electrical signals to acoustic waves and acoustic waves to electrical signals using inverse and direct piezoelectric effects. Acoustic transducers generally include acoustic resonators, such as bulk acoustic wave (BAW) resonators and surface acoustic wave (SAW) and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate acoustic waves that can propagate in lateral directions when stimulated by an applied time-varying electric field, as well as higher order harmonic mixing products. The laterally propagating modes and the higher order harmonic mixing products may have a deleterious impact on functionality.

Figure 1:
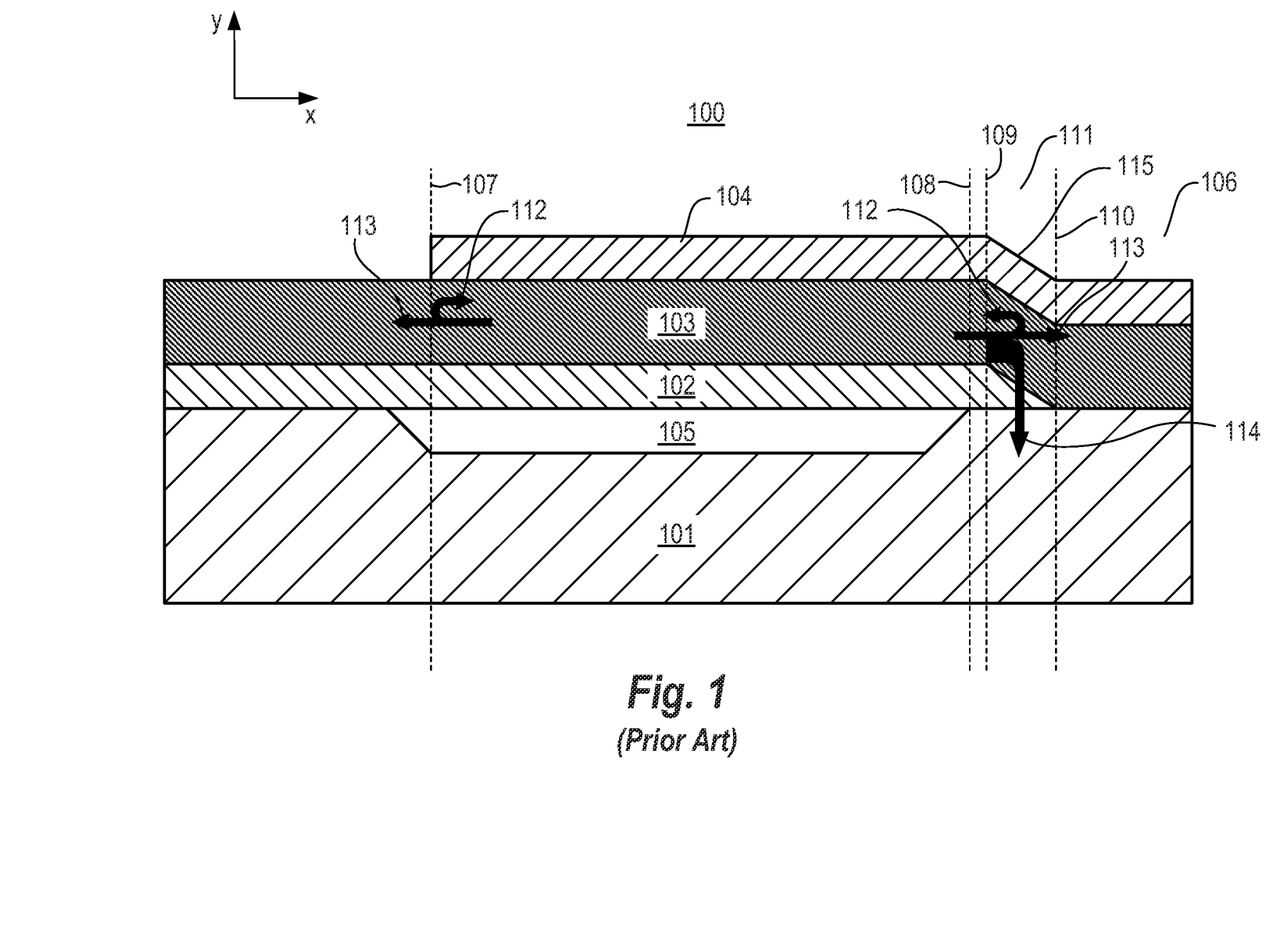
FIG. 1 is a cross-sectional view of a known FBAR.

FIG. 1 depicts a known FBAR 100. A first electrode 102 is provided over a substrate 101. A piezoelectric layer 103 is provided over the first electrode 102, and a second electrode 104 is provided over the piezoelectric layer 103. A cavity 105 is provided in the substrate 101, allowing confinement in the vertical direction (y-direction in the coordinate system of FIG. 1) of thickness extensional (TE) modes to the membrane structure. A connection side 106 of the FBAR 100 allows for electrical signals to be provided to/from the second electrode 104.

As is known, the active region of the FBAR comprises the area of overlap of the first electrode 102, the piezoelectric layer 103, and the second electrode 104 over the cavity 105. To improve performance of the FBAR 100 (as measured by certain quantities such as the quality factor (Q) of the FBAR 100), it is desirable to reduce loss of acoustic energy from the active region. Notably, it is useful to minimize the overlap of first electrode 102, piezoelectric layer 103 and second electrode 104 that extend beyond the cavity 105 (i.e., over the substrate 101), which are referred to as "dead" or "inactive" FBAR regions as these can result in loss of acoustic energy to the substrate 101. Moreover, it is useful to reduce scattering points caused by acoustic impedance discontinuities.

Vertical lines 107, 108, 109 and 110 depict locations of planes where acoustic impedance discontinuities exist between various layers of the FBAR 100. At each of the acoustic impedance discontinuities, electrically excited propagating and evanescent TE modes undergo reflection of the propagating TE mode back to the active region of the FBAR 100, and scattering of both propagating and evanescent TE modes to unwanted shear and flexural modes. Illustratively, at the impedance discontinuities depicted by vertical lines 107, 108, 109 and 110, reflected acoustic energy is depicted by arrows 112, and scattered acoustic energy is depicted by arrows 113 and 114. Specifically, at the termination of the second electrode 104 at vertical line 107, acoustic energy is reflected (arrow 112) and scattered (arrow 113). Similarly, at the edge of the cavity 105 an acoustic discontinuity (vertical line 108), results in reflection (arrow 112) of acoustic energy back to the active region of the FBAR 100 and scattering (arrow 113).

A transition region 111 at connection side 106 is also depicted in FIG. 1. The transition region 111 comprises a slope in the piezoelectric layer 103 and the second electrode 104 that is created by a slope 115 at the termination of the first electrode 102. The first electrode 102 is terminated at slope 115 to reduce the area of the "dead" FBAR outside the cavity 105. While the first electrode 102 terminates, the piezoelectric layer 103 is grown over the substrate 101, and the second electrode 104 is formed over the piezoelectric layer 103 at connection side 106. The piezoelectric layer 103 is grown over the substrate 101 as shown to reduce the occurrence of defects in the layer that can result from abrupt changes in the contour. In furtherance of this, the first electrode 102 does not abruptly terminated, but rather is terminated by the slope 115. Although the slope 115 fosters a reduction of defects in the piezoelectric layer 103, the overall sloping of the first electrode 102, the piezoelectric layer 103 and the second electrode 104 in the transition region 111 results in impedance discontinuities at each change in contour as represented by vertical lines 109, 110. These impedance discontinuities result in scattering of acoustic energy (arrow 113) out of the active region and the scattering of acoustic energy (arrow 114) into the substrate 101. The "sloped" edges created in the first electrode 102, the piezoelectric layer 103 and the second electrode 104 along the connection side are particularly problematic because of the enhanced scattering of acoustic energy (arrow 114) into the substrate.

What is needed, therefore, is a structure useful in mitigating acoustic losses at the boundaries of the BAW resonator to improve mode confinement in the active region of the FBAR.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to bulk acoustic wave (BAW) resonator structures comprising FBARs, double bulk acoustic resonators (DBARs) and coupled resonator filters (CRFs). As will be described more fully below, the FBARs, DBARs and CRFs of the representative embodiments comprise a cavity disposed in a substrate. A first electrode is disposed in the cavity and a planarization layer disposed adjacent to the first electrode. The planarization layer reduces discontinuities on a connection side of the BAW resonator. Beneficially, a reduction of acoustic energy loss from discontinuities is realized, resulting in improvements in Q and parallel impedance (Rp). Additional planarization layers can be provided in "stacked" BAW resonators such as DBARs and CRFs. These planarization layers further reduce the acoustic impedance discontinuities, and the attendant loss of acoustic energy.

Acoustic resonators, and particularly FBARs, can be employed in a variety of configurations for RF and microwave devices such as filters and oscillators operating in a variety of frequency bands. For use in mobile communication devices, one particular example of a frequency band of interest is the 850 MHz "cellular band." In general, the size of a BAW resonator increases with decreasing frequency such that an FBAR for the 850 MHz band will be substantially larger than a similar FBAR for the 2 GHz personal communication services (PCS) band. Meanwhile, in view of continuing trends to miniaturize components of mobile communication device, it may be conceptually imagined that a BAW resonator having a relatively large size may be cut in half, and the two halves, each of which may be considered to be a smaller acoustic resonator, may be stacked upon one another. An example of such a stacked BAW resonator is a DBAR. In certain applications, the BAW resonator structures provide DBAR-based filters (e.g., ladder filters).

A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different series resonance frequencies. The degree of difference in the frequencies of the modes depends, inter alia, on the degree or strength of the coupling between the two FBARs of the CRF. If the degree of coupling between the two FBARs is too great (over-coupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

Certain details of FBARs, DBARs, CRFs, materials thereof and their methods of fabrication may be found in one or more of the following commonly owned U.S. Patents, Patent Application Publications and Patent Applications: U.S. Pat. No. 6,107,721, to Lakin; U.S. Pat. Nos. 5,587,620, 5,873,153, 6,060,818 (Reexamination Application No. 90/010,854) and U.S. Pat. No. 6,507,983 to Ruby, et al.; U.S. Pat. No. 7,629,865 to Ruby, et al.; U.S. Pat. No. 7,280,007 to Feng, et al.; U.S. Patent Application Publication No. 2007/0205850 to Jamneala, et al.; U.S. Pat. No. 7,388,454 to Richard C. Ruby, et al; U.S. Patent Application Publication No. 2010/0327697 to Choy, et al.; and U.S. Patent Application Publication No. 2010/0327994 to Choy, et al. Examples of DBARs and CRFs as well as their materials and methods of fabrication, may be found in U.S. Pat. No. 7,889,024 to Paul Bradley et al., U.S. patent application Ser. No. 13/074,094 of Shirakawa et al., and filed on Mar. 29, 2011, U.S. patent application Ser. No. 13/036,489 of Burak et al., and filed on Feb. 28, 2011, U.S. patent application Ser. No. 13/074,262 to Burak, et al. filed on Mar. 29, 2011, U.S. patent application Ser. No. 13/101,376 of Burak et al., and filed on May 5, 2011, and U.S. patent application Ser. No. 13/161,946 to Burak, et al., and filed on Jun. 16, 2011. The disclosures of these patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

Embodiments Comprising an FBAR

Figure 2A:
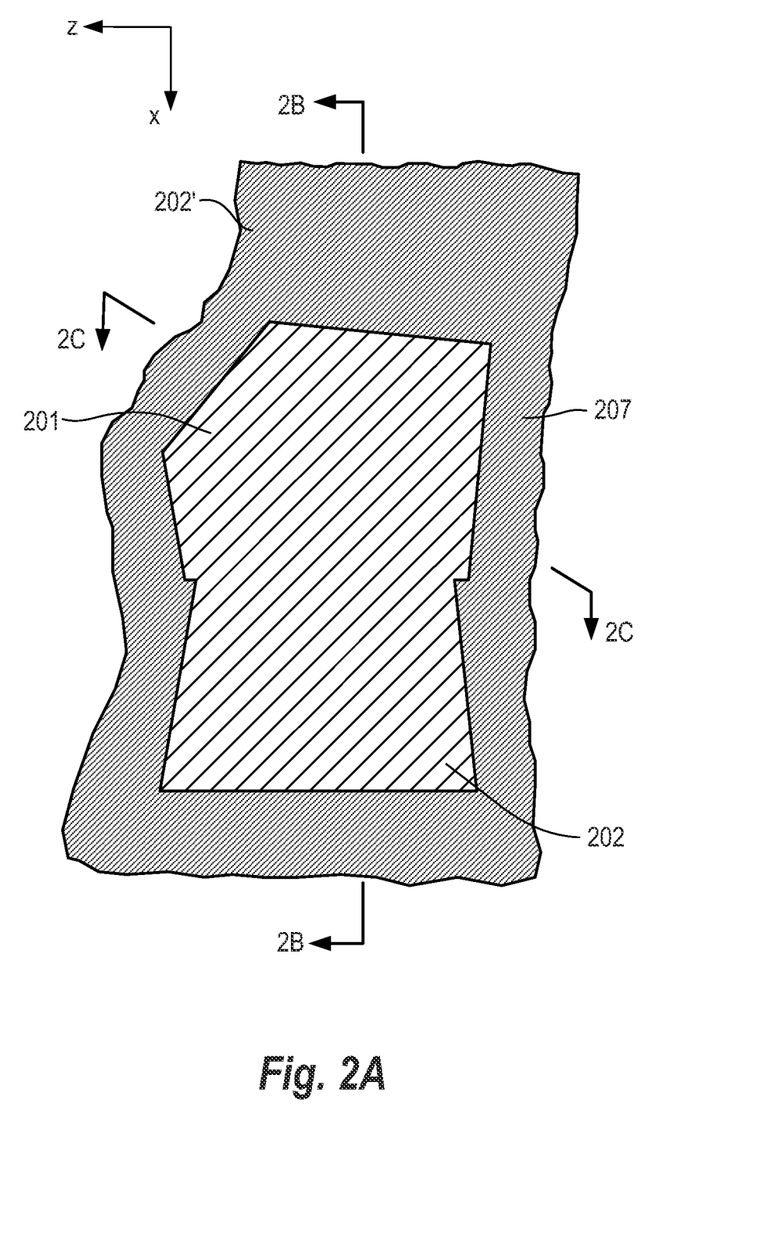
FIG. 2A shows a top-view of an FBAR in accordance with a representative embodiment.

FIG. 2A shows a top view of an FBAR 200 in accordance with a representative embodiment. The FBAR 200 comprises an upper electrode 201 (referred to below as second electrode 201), illustratively comprising five (5) sides, with an upper connection side 202 (referred to below as second connection side 202) and a lower connection side 202' (referred to below as first connection side 202') configured to provide the electrical connections to the FBAR 200. As depicted in FIG. 2A and in FIGS. 2B~2E, second connection side 202 is generally a continuation of the conductive layer that comprises the second electrode 201. The second connection side 202 and the first connection side 202' provide paths for electrical signals to the second electrode 201 and the first electrode (not depicted in FIG. 2A) to excite desired acoustic waves in piezoelectric layer 207 of the FBAR 200.

Figure 2B:
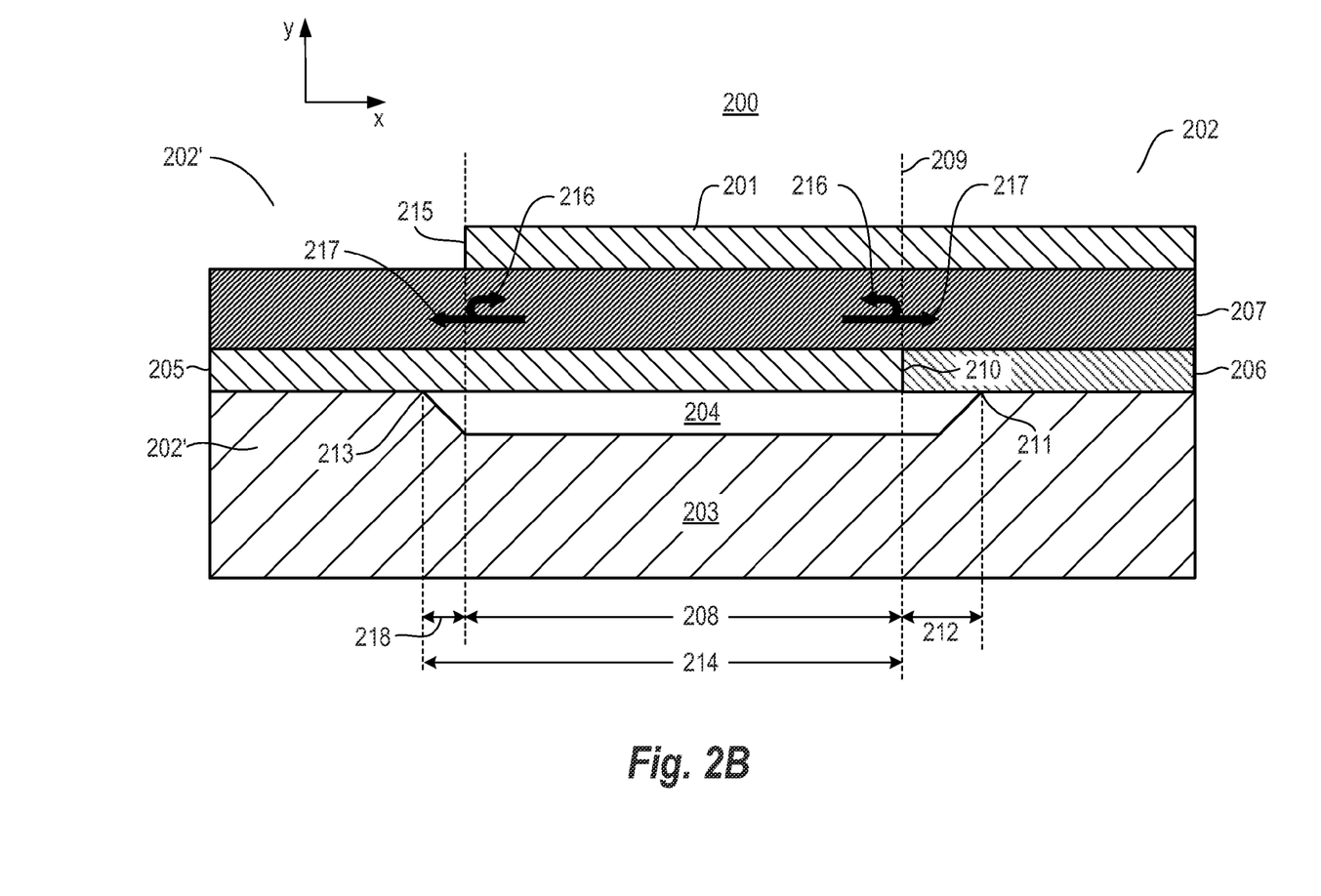
FIG. 2B is a cross-sectional view of the FBAR of FIG. 2A, taken along the line 2B-2B.

FIG. 2B shows a cross-sectional view of FBAR 200 depicted in FIG. 2A and taken along the line 2B-2B. A substrate 203 comprises a cavity 204. A first electrode 205 is disposed over the substrate 203 and is suspended over the cavity 204. A planarization layer 206 is provided over the substrate 203 and may be non-etchable borosilicate glass (NEBSG). As will become clearer as the present description continues, the planarization layer 206 enables the area of the "dead" FBAR region to be minimized, while at the same time enables the reduction of acoustic impedance discontinuities that can result in known FBAR structures (e.g., FBAR 100) in which the "lower" electrode terminates before the piezoelectric layer and before the "upper" electrode (e.g., first electrode 102 of FBAR 100 terminates before the piezoelectric layer 103 and second electrode 104 in FBAR 100).

A piezoelectric layer 207 is provided over the first electrode 205, and comprises highly-textured c-axis piezoelectric material such as aluminum nitride (AlN) or zinc oxide (ZnO). The second electrode 201 is disposed over the piezoelectric layer 207.

The overlap of the cavity 204, the first electrode 205, the piezoelectric layer 207, and the second electrode 201 defines the active region 208 of the FBAR 200. In representative embodiments described below, acoustic losses at the boundaries of FBAR 200 are mitigated to improve mode confinement in the active region 208.

In the embodiment depicted in FIG. 2B, the first electrode 205 extends only partially over the width (x-direction in the coordinate system of FIG. 2B) of the cavity 204 and abuts the planarization layer 206 at a termination edge 210 (bounded by dashed line 209). The cavity 204 has a first edge 211 adjacent to the second connection 202 of the first electrode 205. In the depicted embodiment, the planarization layer 206 extends over the first edge 211 of the cavity 204 by a distance 212 and abuts a termination edge 210 of the first electrode 205 on the second connection 202. Accordingly, in the representative embodiment of FIG. 2B, the first electrode 205 does not extend across the cavity 204 to the first edge 211. By selecting the first edge 211 of the cavity 204 to be x=0, the distance 212 to the termination edge 210 is negative in the depicted embodiment. Alternatively, if the first electrode 205 extended over the cavity 204, the distance 212 from the first edge 211 to the termination edge 210 would be positive (see FIG. 2E).

The termination edge 210 of the first electrode 205 is disposed at an angle relative to the substrate 203 (x-direction in the coordinate system of FIG. 2B). In the embodiment depicted in FIG. 2B, the termination edge 210 is disposed at 90° relative to the substrate 203. The planarization layer 206 abuts the termination edge 210 at an angle that is the supplementary angle of the angle of the termination edge 210. As such, in the embodiment depicted in FIG. 2B, planarization layer 206 is disposed at an angle of 90° relative to the substrate 203. It is noted that the termination edge 210 does not need to be disposed at 90° relative to the substrate 203, and can be at other angles. However, the planarization layer 206 always terminates at an angle that is substantially supplementary to the angle of the termination edge 210 so that the planarization layer 206 is substantially "flush" in the vertical dimension (y-dimension in the coordinate system of FIG. 2B) with the first electrode 205. By having the first electrode 205 substantially flush with the planarization layer 206, a planar transition is realized at the second connection 202 and the acoustic impedance discontinuities that occur from such slopes are substantially avoided. Moreover, the planarization layer 206 beneficially improves the quality of growth of subsequent layers (e.g., highly textured c-axis piezoelectric material) and simplifies their processing.

The second electrode 201 has a termination edge 215 on a side opposing the second connection side 202. Like the termination edge 210 of the first electrode 205, termination edge 215 provides an acoustic impedance discontinuity. At the termination edge 210 of the first electrode 205 and at the termination edge 215 of the second electrode 201, acoustic energy is reflected (represented by arrows 216) back toward the active region 208 of the FBAR 200. This reflected energy is not immediately lost to the "dead" FBAR region outside the active region 208. However, acoustic energy is also scattered at the termination edge 210 of the first electrode 205 and at the termination edge 215 of the second electrode 201. However, as a result of the substantially planar structure on the side of second connection 202 provided by the planarization layer 206, acoustic losses to scattering are reduced because distributed impedance discontinuities that result from the "sloped" contour in the connection region (e.g., as depicted in FIG. 1) are substantially eliminated.

As depicted in FIG. 2B, the planarization layer 206 extends over the first edge 211 of the cavity 204. This configuration provides a significant advantage over known BAW resonators through the substantial elimination of the "dead" FBAR region. The "dead" region of a BAW resonator is a region of the BAW resonator where the lower electrode, the upper electrode and the piezoelectric layer 207 overlap with the substrate 203 and not the cavity of the other acoustic reflector. Acoustic energy generated in the "dead" region of the BAW resonator can be scattered into the substrate (e.g., shown by arrow 114 in FIG. 1). Scattering of acoustic energy into the substrate can have a deleterious impact on the electrical performance of the BAW resonator, manifest in reduced Q and $R_p$ of the BAW resonator.

As can be appreciated, the FBAR 200 depicted in FIG. 2B does not include a "dead" FBAR region because the first electrode 205, the second electrode 201 and the piezoelectric layer 207 do not overlap the substrate 203, except over the cavity 204. As described more fully below, an overall improvement in Q and $R_p$ are realized.

There are three distinct termination edges of layers of FBAR 200 that are located to optimize the Q-factor of the FBAR 200 by reducing energy loss to scattering and undesired modes. Two of these termination edges are located on connection sides (e.g., first connection side 202' and second connection side 202) of first and second electrodes 205, 201 of the FBAR 200 and are described presently in connection with FIG. 2B. The third type of termination edges, which are not connected, are described in connection with FIG. 2C.

With reference to FIG. 2B, the location of the termination edge 215 of the second electrode 201 is determined by the distance 218 between termination edge 215 and the second edge 213 of the cavity 204. The location of termination edge 210 of first electrode 205 is determined by the distance 212 between the termination edge 210 of the first electrode 205 and the first edge 211 of the cavity 204.

Figure 2C:
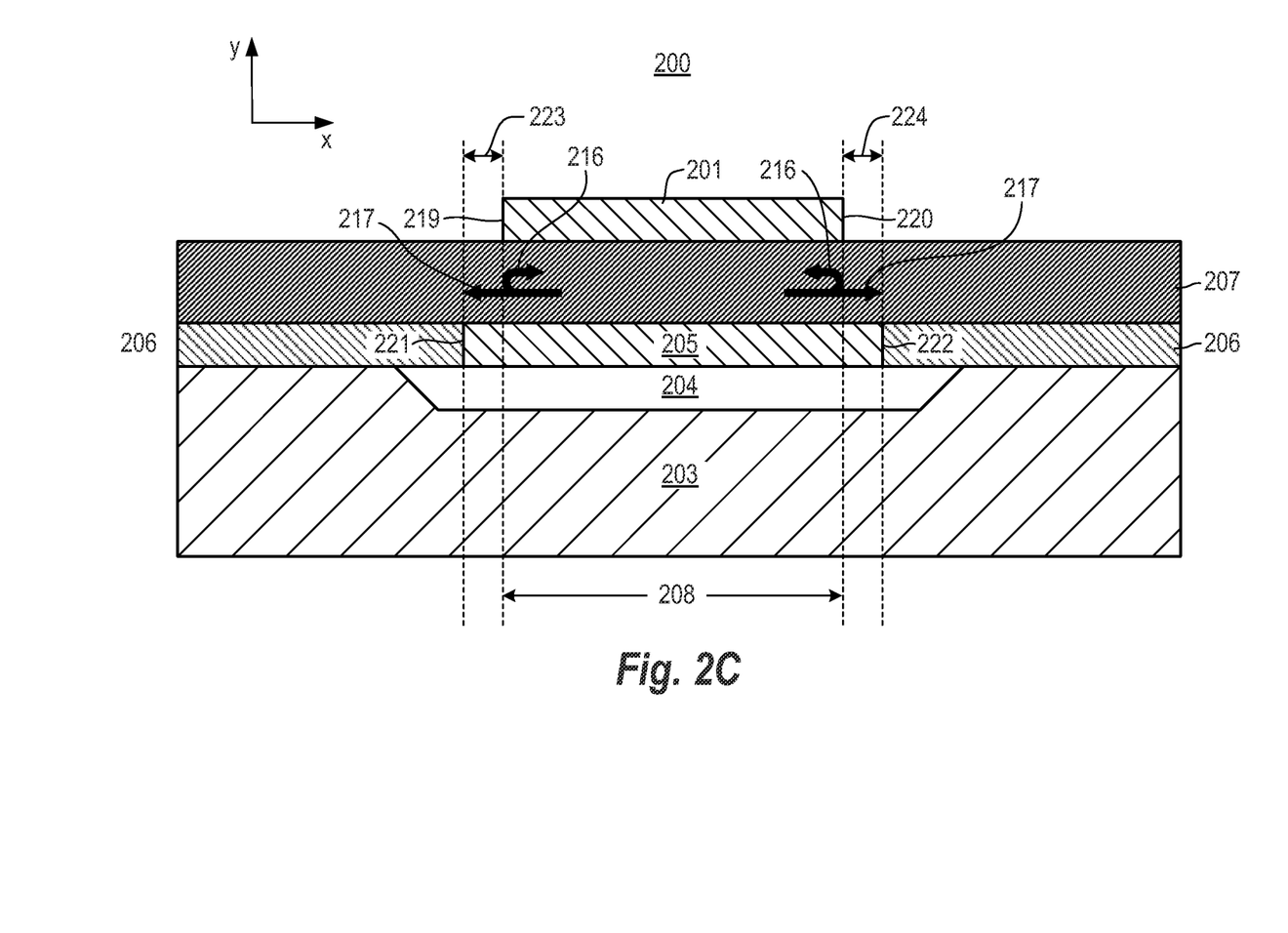
FIG. 2C is a cross-sectional view of the FBAR of FIG. 2A, taken along the line 2C-2C.

FIG. 2C shows a cross-sectional view of FBAR 200 depicted in FIG. 2A and taken along the line 2C-2C. Termination edges 219, 220 of the second electrode 201 and termination edges 221, 222 of the first electrode 205 are not located on connection sides of the FBAR 200. The locations of termination edges 219~222 are determined, up to the first approximation (that is neglecting effects related to the presence of first and second edges 211, 213 of cavity 204), by the distances 223 and 224 separating the termination edges 219, 221 and 220, 222 of respective first and second electrodes 205, 201 and depicted in FIG. 2C.

In general, the improved energy confinement can be achieved if distances 212, 218, 223 and 224 are selected to be an odd integer multiple of one-quarter wavelength ($\lambda/4$) of a complex thickness-extensional eigenmode that exists beyond termination edges 210, 215, 219, 220, 221 and 222 (i.e., not in the active region 208 of the FBAR 200). Selection of distances that meet this condition provides beneficial suppression of the modal amplitude allowed beyond the active region 208 of the membrane of FBAR 200. The suppression of modal amplitude beyond the active region 208 beneficially results in a higher Q and parallel resistance Rp of FBAR 200.

As noted above, many details of the methods and materials used to fabricate the FBAR 200 of the representative embodiment are described in commonly owned patents and patent applications referenced above. The planarization layer 206 (and other planarization layers described in representative embodiments below) is fabricated by variation of such known methods, which are described presently.

After forming the cavity 204 in the substrate 203, a sacrificial material (not shown) is provided in the cavity 204. The first electrode 205 is formed over the substrate 203 by a known method. The first electrode 205 extends only partially across the sacrificial material (i.e., by distance 214). The planarization layer 206 is then provided over the substrate 203 beneath second connection side 202 and extends over the sacrificial layer by distance 212 from the first edge 211 of the cavity 204. The deposition of the planarization layer 206 also results in planarization material being deposited over the first electrode 205. A known planarization method (e.g., chemical-mechanical polishing (CMP)) is used to remove the planarization material from the upper surface of the first electrode 205, and so the planarization layer 206 is substantially "flush" with the first electrode 205. After the planarization step is completed, the piezoelectric layer 207 and the second electrode 201 are formed using known methods and materials. After the layer structure of the FBAR 200 is completed, the sacrificial layer is removed and the cavity 204 is revealed.

In a representative embodiment, after the planarization step is effected, the planarization layer 206 has a thickness that is substantially the same as the thickness of the first electrode 205. As such, the planarization layer 206 is substantially flush with the first electrode 205. The planarization layer 206 comprises a suitable material that will not be removed or altered in any subsequent processing (e.g., removal of the sacrificial material from the cavity 204) after planarization is completed. Illustratively, the planarization layer 206 comprises a glass material much as non-etchable borosilicate glass (NEBSG). However, other materials are contemplated by the present teachings with certain desired electrical properties, acoustical properties and mechanical properties and certain desired processing properties.

In order to provide confinement of electrical currents and fields to the active region 208 of FBAR 200 the material selected for planarization layer 206 is beneficially a dielectric material, and illustratively is selected to have a comparatively low relative dielectric constant to minimize fringing of electric field beyond termination edge 210.

Moreover, the material used for the planarization layer 206 is selected to reduce or eliminate the existence of trapped acoustic waves at the interface of the planarization layer 206 and the piezoelectric layer 207. Such trapped acoustic waves foster unwanted leakage of acoustic energy to the region outside of cavity 204.

The material used for the planarization material forms a mechanically rugged interface of the planarization layer 206 and the first electrode 205. Notably, voids at the interface of the planarization layer 206 and the first electrode 205 could result conversion of thickness extensional motion of the active region 208 of the FBAR 200 into unwanted shear and flexural modes. In addition, random closing of such voids during the device operation (under high electric field operation conditions) would cause unwanted increase of noise generated by the filter. Moreover, the material selected for the planarization layer 206 should also form a comparatively solid interface with the material of the piezoelectric layer 207 to avoid delamination of the layers that form the FBAR 200.

Finally, the planarization material should be sufficiently "soft" to allow for removal and smoothing with the subsequent removal/planarization step (e.g., CMP).

Figure 2D:
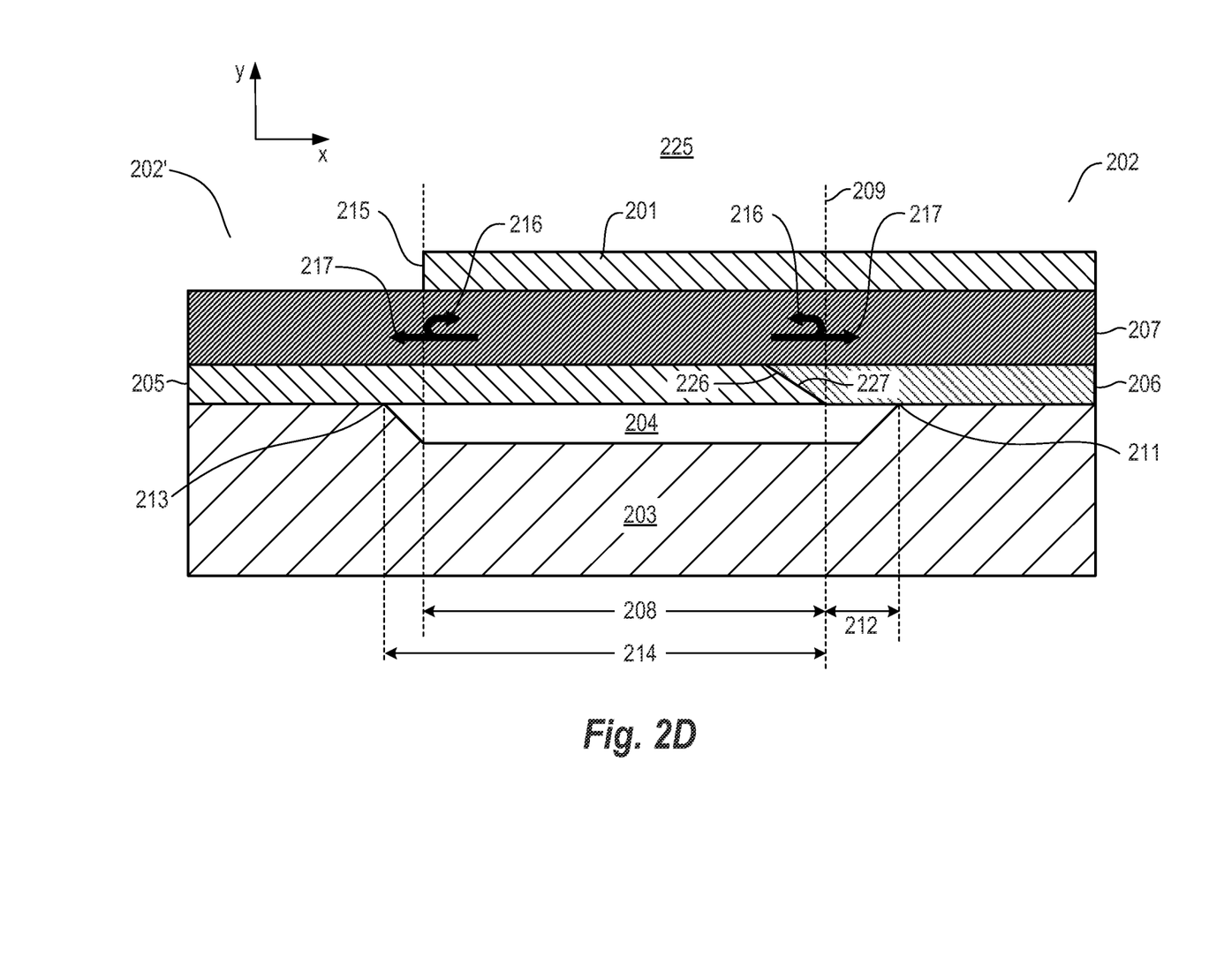
FIG. 2D is a cross-sectional view of an FBAR in accordance with a representative embodiment.

FIG. 2D shows a cross-sectional view of FBAR 225 in accordance with a representative embodiment. Many aspects of the FBAR 225 and its methods of fabrication are common to those of FBAR 200 and are not repeated in order to avoid obscuring the description of the presently described representative embodiment.

The FBAR 225 comprises planarization layer 206 that extends past the first edge 211 of the cavity 204, and first electrode 205 terminating over the cavity 204 such as described above. Unlike FBAR 200 in which the termination edge 210 of the first electrode 205 is parallel to a normal (i.e., y-direction of the coordinate system of FIG. 2B) to the substrate 203, the first electrode 205 has a termination edge 226 that is oriented at a non-zero angle relative to the normal (i.e., y-direction of the coordinate system of FIG. 2D). In a representative embodiment, the termination edge 226 may be oriented at an angle of up to approximately 75° relative to the normal to the substrate 203. In one embodiment, the termination edge 226 is oriented at an angle of 45° relative to the normal. The planarization layer 206 comprises a termination edge 227 at a non-zero angle relative to the normal to the substrate 203. As depicted in FIG. 2D, the termination edge 227 is at a supplementary angle (measured from relative to the x-axis in the coordinate system of FIG. 2D) to the angle of the termination edge 226 (relative to the x-axis), so that the opposing termination edges 226, 227 are substantially flush relative to one another. Termination edge 226 beneficially creates a more rugged connection between the first electrode 205 and the planarization layer 206 as the area of overlap between these two materials is increased. On the other hand, the drawback of such connection is that it creates slanted interface that tends to enhance spurious mode excitation and somewhat reduce the Q-factor and Rp of FBAR 225.

As described above, the planarization layer 206 provides a substantially planar structure on the second connection side 202, thereby substantially eliminating the "dead" FBAR region found in known FBAR devices. As such, acoustic losses to scattering are reduced because impedance discontinuities that result from the "sloped" contour in the connection region (e.g., as depicted in FIG. 1) are substantially eliminated. Additionally, the planarization layer 206 beneficially improves the quality of growth of subsequent layers (e.g., highly textured c-axis piezoelectric material) and simplifies their processing.

Referring to FIG. 2B, the second electrode 201 has a termination edge 215 on a side opposing the second connection side 202. Like the termination edge 210 of the first electrode 205, termination edge 215 provides an acoustic impedance discontinuity. At the termination edge 210 of the first electrode 205 and at the termination edge 215 of the second electrode 201, acoustic energy is reflected (represented by arrows 216) back toward the active region 208 of the FBAR 200. This reflected energy is not immediately lost to the "dead" FBAR region outside the active region 208. However, acoustic energy is also scattered at the termination edge 210 of the first electrode 205 and at the termination edge 215 of the second electrode 201. However, as a result of the substantially planar structure on the second connection side 202 provided by the planarization layer 206, acoustic losses to scattering are reduced because impedance discontinuities that result from the "sloped" contour in the connection region (e.g., as depicted in FIG. 1) are substantially eliminated.

Figure 2E:
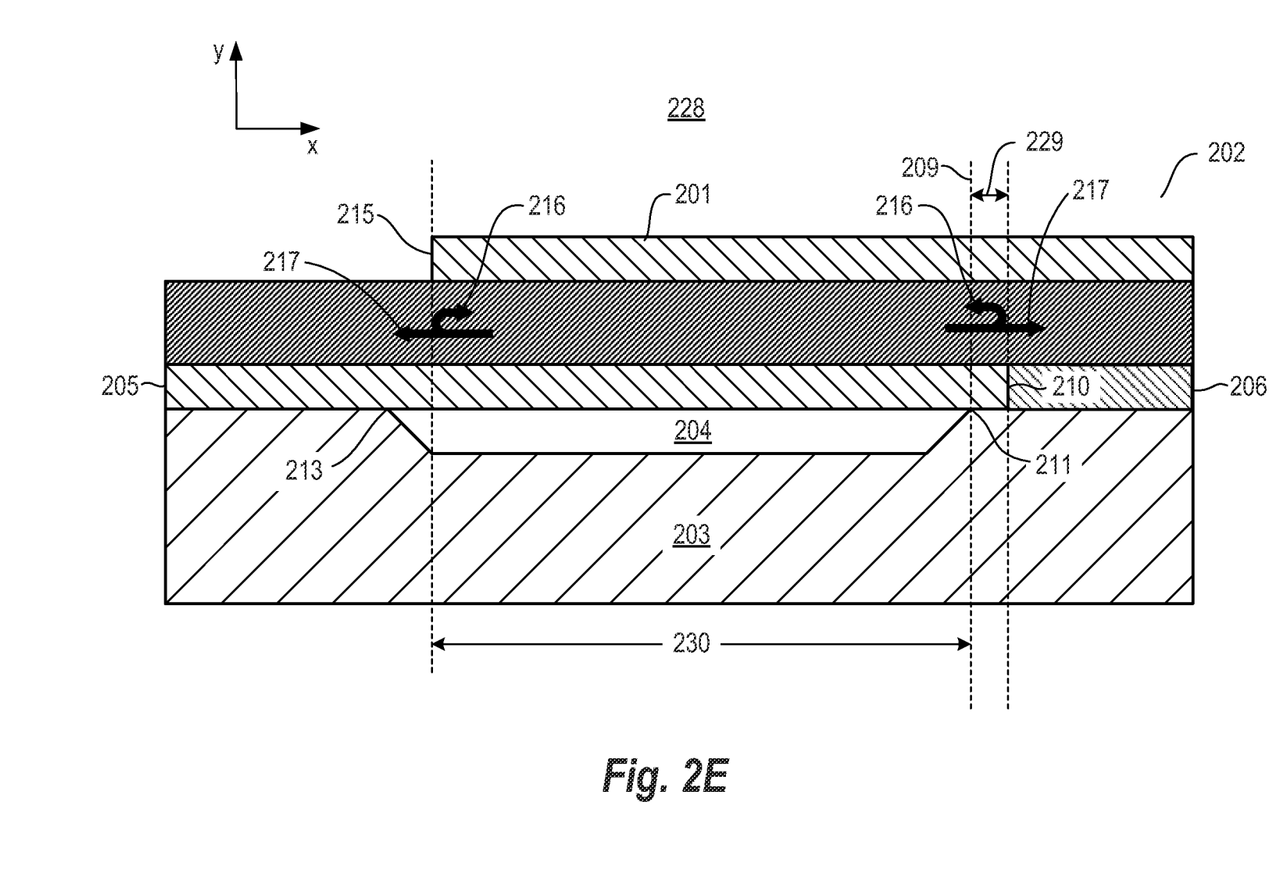
FIG. 2E is a cross-sectional view of an FBAR in accordance with a representative embodiment.

FIG. 2E shows a cross-sectional view of FBAR 228 in accordance with a representative embodiment. Many aspects of the FBAR 228 and its methods of fabrication are common to those of FBAR 200 and are not repeated in order to avoid obscuring the description of the presently described representative embodiment.

In FBAR 228, the first electrode 205 spans the cavity 204 and is disposed over the substrate 203 beneath second connection 202 of the FBAR 228. As such, the first electrode 205 extends over second edge 213 of the cavity 204 and across the opposing first edge 211 of the cavity 204. The first electrode 205 extends over the substrate 203 by a distance 229, and abuts the planarization layer 206. As before, by selecting the first edge 211 of the cavity 204 to be x=0, the distance 229 to the termination edge 210 is positive. In a representative embodiment, the distance 229 is equal to or smaller than a quarter wavelength of a first propagating eigenmode in the active region 208 of FBAR 200. In general, terminating the first electrode 205 over the substrate will create a "dead" FBAR region at the overlap of the first electrode 205, the piezoelectric layer 207 and the second electrode 201 over the substrate 203 and not over the cavity 204. The "dead" FBAR region will result in some loss of acoustic energy into the substrate 203. Beneficially, however, the configuration depicted in FIG. 2E will increase a robustness of the FBAR 228. Numerical simulations also show that if the distance 229 is equal to a quarter wavelength of the propagating thickness extensional mode in the active region 230, residual improvement of the Q-factor and Rp can be realized.

As described above, the planarization layer 206 provides a substantially planar structure on the second connection side 202, thereby substantially eliminating the "dead" FBAR region found in known FBAR devices. As such, acoustic losses to scattering are reduced because impedance discontinuities that result from the "sloped" contour in the connection region (e.g., as depicted in FIG. 1) are substantially eliminated. Additionally, the planarization layer 206 beneficially improves the quality of growth of subsequent layers (e.g., highly textured c-axis piezoelectric material) and simplifies their processing.

Embodiments Comprising a Double Bulk Acoustic Resonator (DBAR)

Figure 3:
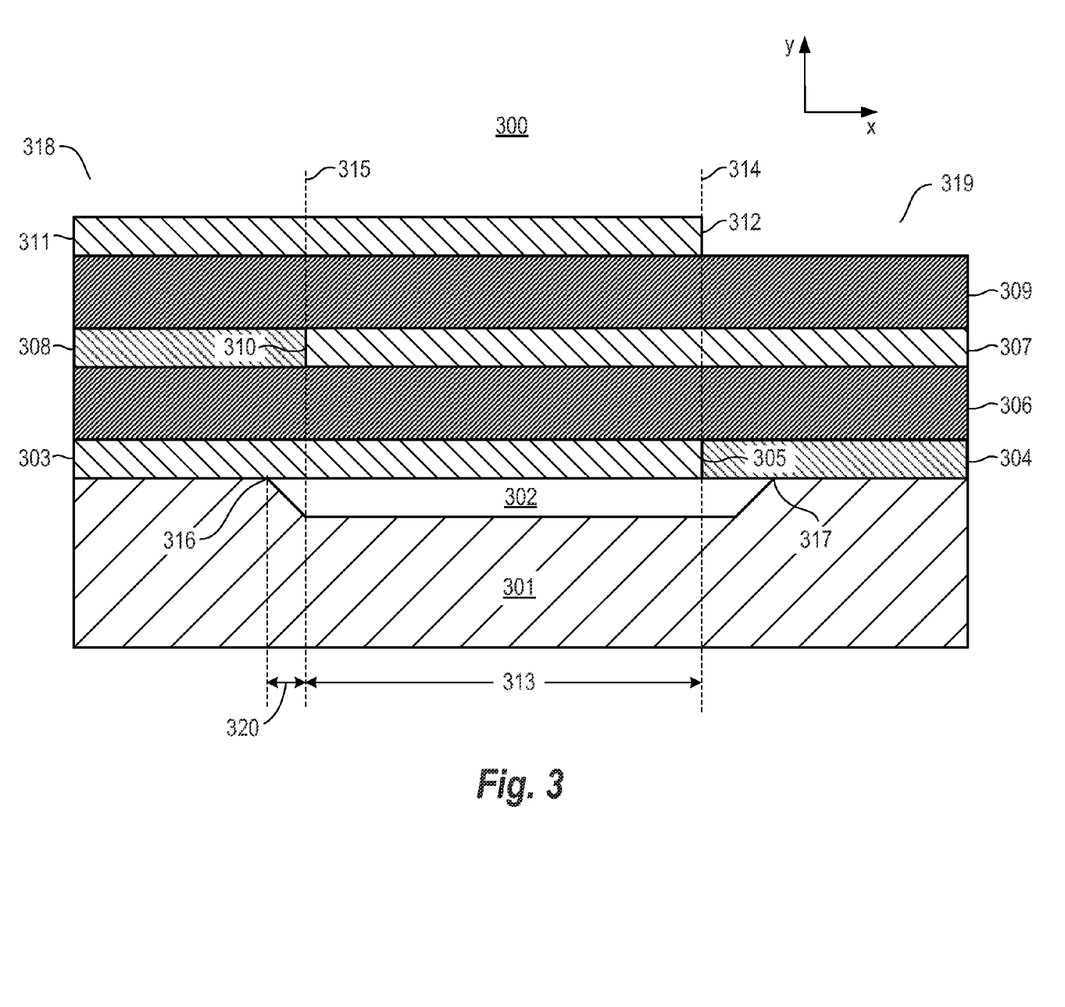
FIG. 3 is a cross-sectional view of a double bulk acoustic resonator (DBAR) in accordance with a representative embodiment.

FIG. 3 is a cross-sectional view of a double bulk acoustic resonator (DBAR) in accordance with representative embodiments. Many details of the presently described embodiment are common to those described above in connection with the representative embodiments of FIGS. 2A-2E. Generally, the common details are not repeated in the description of embodiments comprising a DBAR.

FIG. 3 is a cross-sectional view of a DBAR 300 in accordance with a representative embodiment. A substrate 301 comprises a cavity 302. A first electrode 303 is disposed over the substrate 301 and is suspended over the cavity 302. A first planarization layer 304 is provided over the substrate 301 and abuts a first termination edge 305 of the first electrode 303.

A first piezoelectric layer 306 is provided over the first electrode 303, and comprises highly-textured c-axis piezoelectric material such as aluminum nitride (AlN) or zinc oxide (ZnO). A second electrode 307 is disposed over the first piezoelectric layer 306. A second planarization layer 308 is provided over the first piezoelectric layer 306, and abuts a second termination edge 310 of the second electrode 307.

A second piezoelectric layer 309 is disposed over the second electrode 307 and the second planarization layer 308. A third electrode 311 is disposed over the second piezoelectric layer 309.

The DBAR 300 comprises an active region 313 between lines 314, 315 and comprising an overlap of the cavity 302, the first electrode 303, the first piezoelectric layer 306, the second electrode 307, the second piezoelectric layer 309 and the third electrode 311.

As depicted in FIG. 3, the first electrode 303 extends over a first edge 316 of the cavity 302, but the first termination edge 305 of the first electrode 303 does not reach a second edge 317 of the cavity 302. Thus, the first electrode 303 does not span the cavity 302 in the representative embodiment. Similarly, the second electrode 307 extends over the second edge 317 of the cavity 302, but the second termination edge 310 of the second electrode 307 does not reach the first edge 316 of the cavity 302. Thus, the second electrode 307 does not span the cavity 302 in the representative embodiment. Finally, the third electrode 311 extends over the first edge 316 of the cavity 302, but the first termination edge 305 of the first electrode 303 does not reach the second edge 317 of the cavity 302. Thus, the third electrode 311 does not span the cavity 302.

As can be appreciated, a "dead" DBAR region comprises an overlap not over the cavity 302 of the first electrode 303, the first piezoelectric layer 306, the second electrode 307, the second piezoelectric layer 309 and the third electrode 311. However, because the first and second planarization layers 304, 308 extend over respective first and second edges 316, 317 of the cavity 302, there is no region where the first electrode 303, the first piezoelectric layer 306, the second electrode 307, the second piezoelectric layer 309 and the third electrode 311, overlap one another, but do not overlap the cavity 302. As such, in the depicted embodiment, there is no "dead" DBAR on a first connection side 318 (connection to first and third electrodes 303, 311), and no "dead" DBAR on a second connection side 319 (connection to the second electrode 307).

While it is useful for the first termination edge 305 of the first electrode 303, and/or the second termination edge 310 of the second electrode 307 and/or the third termination edge 312 of the third electrode 311 to occur over the cavity 302 as described above, this is not essential. Rather, one or more of the first, second and third electrodes 303, 307 and 311 can span the cavity 302, and respective first, second and third termination edges 305, 310, 312 are located over the substrate 301 in respective first and second connection sides 318, 319.

Regardless of the location of the first, second and third termination edges 305, 310, 312, the first planarization layer 304 and the second planarization layer 308 each provide a substantially planar layer stack and the benefits thereof. Notably, along the first and second connection sides 318, 319, each layer is substantially planar. As such, acoustic losses to scattering are reduced because impedance discontinuities that result from the "sloped" contour in known devices (e.g., as depicted in FIG. 1) are substantially eliminated. Additionally, the first and/or second planarization layer 304, 308 beneficially improves the quality of growth of subsequent layers (e.g., highly textured c-axis piezoelectric material) and simplify their processing.

Finally, the location of the first, second and third termination edges 305, 310, 312 are selected to provide the first, second and third electrodes 300, 307, 311 with a particular length to further improve desired reflections of acoustic energy "back" to the active region 313, and thereby improve the performance of the DBAR 300 by reducing acoustic losses to undesired modes. Notably, in a representative embodiment, the first and third electrodes 303 and 311 each may terminate over the cavity 302 at a distance from/before second edge 317 of the cavity 302 (i.e., a distance between line 314 and the second edge 317 of the cavity 302), with the distance being equal to an odd integer multiple of one-quarter wavelength of a fundamental (TE2) complex propagating eigenmode in the region between the first and third termination edges 305, 312 of the first and third electrodes 303, 311, respectively, and the second edge 317 of the cavity 302. Similarly, the second electrode 307 may terminate over the cavity 302 at a distance from the first edge 316 of the cavity 302 (i.e., a distance between the first edge 316 of the cavity 302 and line 315) equal to an odd integer multiple of one-quarter wavelength of a fundamental (TE2) complex propagating eigenmode in the region between the second termination edge 310 and the first edge 316 of cavity 302.

In another representative embodiment, one or more of the first, second and third electrodes 303, 307 and 311 span the cavity 302, and respective first, second and third termination edges 305, 310, 312 are located over the substrate 301 in respective first and second connection sides 318, 319. In such an embodiment, the first and third electrodes 303 and 311 could extend past the second edge 317 of the cavity 302 and the first and third termination edges 305, 312 could be located over the substrate 301 in the second connection side 319. Similarly, the second electrode 307 could extend past the first edge 316 of the cavity 302, and the second termination edge 310 could be located over the substrate 301 in the first connection side 318. In general, similar considerations as for FBAR 228 would apply when extending first, second and third electrodes 303, 307, 311 over the substrate 301 in DBAR 300

As noted above, many details of the methods and materials used to fabricate the DBAR 300 of the representative embodiment are described in commonly owned patents and patent applications referenced above. The first planarization layer 304 (and other planarization layers described in representative embodiments below) is fabricated by variation of such known methods, which are described presently.

After forming the cavity 302 in the substrate 301, a sacrificial material (not shown) is provided in the cavity 302. The first electrode 303 is formed over the substrate 301 by a known method. The first electrode 303 extends only partially across the sacrificial material. The first planarization layer 304 is then provided over the substrate 301 and extends over the sacrificial layer by a distance 320 from first edge 316 of the cavity 302. The deposition of the first planarization layer 304 also results in planarization material being deposited over the first electrode 303. A known planarization method (e.g., (CMP)) is used to remove the planarization material from the upper surface of the first electrode 303, and so the first planarization layer 304 is substantially "flush" with the first electrode 303. After the planarization step is completed, the first piezoelectric layer 306 and the second electrode 307 are formed using known methods and materials. The second planarization layer 308 is then provided over the first piezoelectric layer 306 and extends over the cavity 302 by distance 320 from first edge 316 of the cavity 302. The deposition of the second planarization layer 308 also results in planarization material being deposited over the second electrode 307. A known planarization method (e.g., (CMP)) is used to remove the planarization material from the upper surface of the second electrode 307, and so the second planarization layer 308 is substantially "flush" with the second electrode 307.

The second piezoelectric layer 309 and the third electrode 311 are fabricated over the second piezoelectric layer 309 using known methods and materials. After the layer structure of the DBAR 300 is completed, the sacrificial layer is removed and the cavity 302 is revealed.

In a representative embodiment, after the planarization step is effected, the first planarization layer 304 has a thickness (y-direction of the coordinate system of FIG. 3) that is substantially the same as the thickness of the first electrode 303. As such, the first planarization layer 304 is substantially flush with the first electrode 303. Similarly, after the second planarization step, the second planarization layer 308 has a thickness (y-direction of the coordinate system of FIG. 3) that is substantially the same as the thickness of the second electrode 307. As such, the second planarization layer 308 is substantially flush with the second electrode 307. As noted above, the first and second planarization layers 304, 308 each comprise a suitable material that will not be removed or altered in any subsequent processing (e.g., removal of the sacrificial material from the cavity 302) after planarization is completed. Illustratively, the planarization layer 304 comprises a glass material such as non-etchable borosilicate glass (NEBSG).

Embodiments Comprising a Coupled Resonator Filter (CRF)

Figure 4:
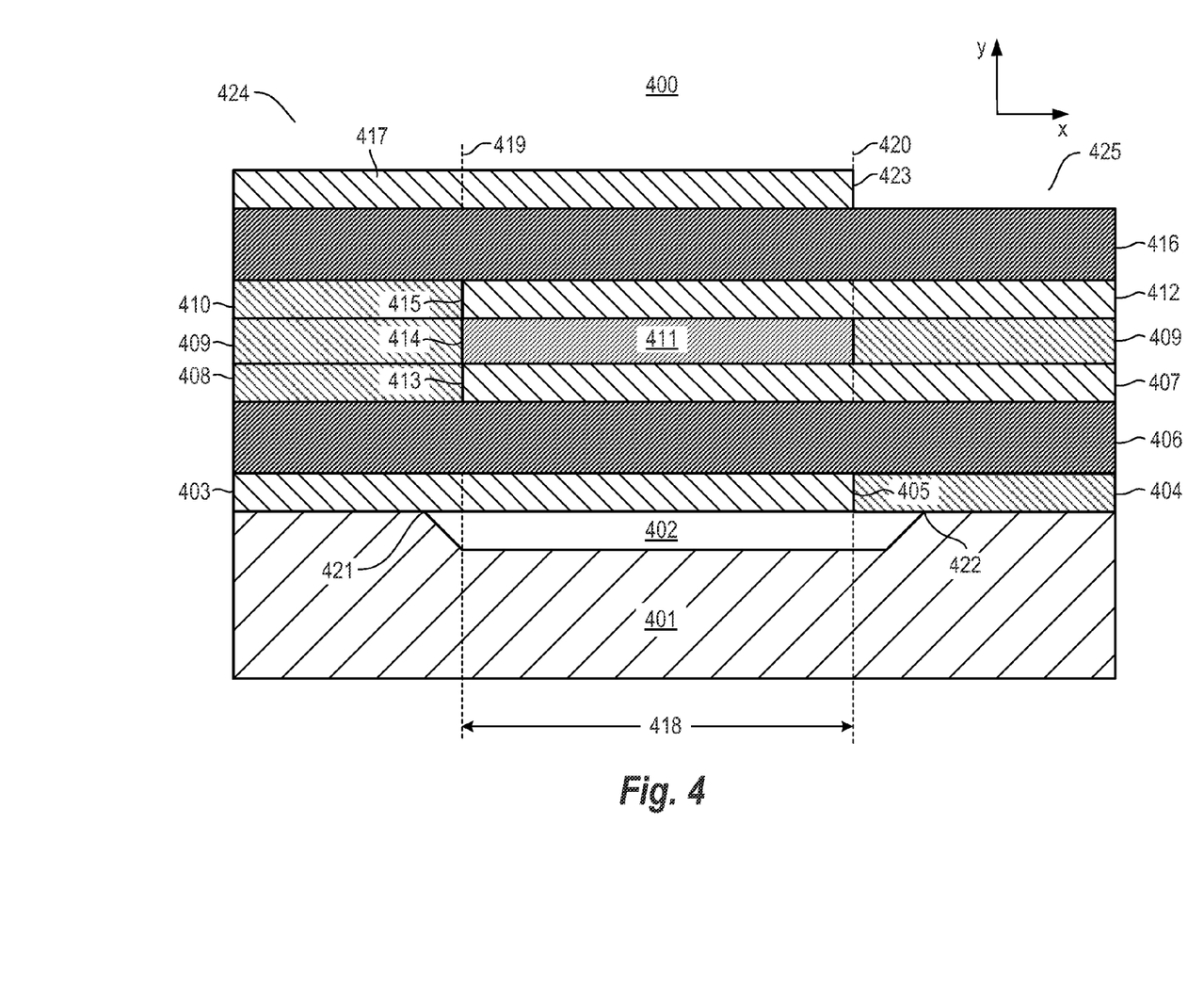
FIG. 4 is cross-sectional views of coupled resonator filter (CRF) in accordance with a representative embodiment.

FIG. 4 is a cross-sectional view of a coupled resonator filter (CRF) 400 in accordance with a representative embodiment. Many details of the present embodiments are common to those described above in connection with the representative embodiments of FIGS. 2A-3. Generally, the common details are not repeated in the description of embodiments comprising CRF 400.

A substrate 401 comprises a cavity 402. A first electrode 403 is disposed over the substrate 401 and is suspended over the cavity 402. A first planarization layer 404 is provided over the substrate 401 and abuts a termination edge 405 of the first electrode 403.

A first piezoelectric layer 406 is provided over the first electrode 403, and comprises highly-textured c-axis piezoelectric material such as aluminum nitride (AlN) or zinc oxide (ZnO). A second electrode 407 is disposed over the first piezoelectric layer 406.

A second planarization layer 408 is provided over the first piezoelectric layer 406 and abuts the second electrode 407. The acoustic coupling layer 411 is provided over the second electrode 407. Acoustic coupling layer 411 illustratively comprises carbon doped oxide (CDO), or NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the acoustic coupling layer 411 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 112 is selected to provide comparatively low acoustic impedance and loss in order to provide desired pass-band characteristics.

As depicted in FIG. 4, the acoustic coupling layer 411 is disposed over the second electrode 407. A third planarization layer 409 is provided over the second electrode 407 and second planarization layer 408, and abuts the acoustic coupling layer 411. A third electrode 412 is provided over the acoustic coupling layer 411 and the third planarization layer 409. A fourth planarization layer 410 is provided over the third planarization layer 409 and abuts the third electrode 412.

A second piezoelectric layer 416 is provided over the third electrode 412 and the fourth planarization layer 410. A fourth electrode 417 is provided over the second piezoelectric layer 416.

The CRF 400 comprises an active region 418 between lines 419, 420 and comprising an overlap of the cavity 402, the first electrode 403, the first piezoelectric layer 406, the second electrode 407, the acoustic coupling layer 411, the third electrode 412, the second piezoelectric layer 416 and the fourth electrode 417.

As depicted in FIG. 4, the first electrode 403 extends over a first edge 421 of the cavity 402, but the termination edge 405 of the first electrode 403 does not reach a second edge 422 of the cavity 402. Thus, the first electrode 403 does not span the cavity 402 in the representative embodiment. Similarly, the second electrode 407 and the third electrode 412 each extend over the second edge 422 of the cavity 402, but the termination edge 413 of the second electrode 407, the termination edge 414 of the acoustic coupling layer 411, and the termination edge 415 of the third electrode 412 do not reach the first edge 421 of the cavity 402. Thus, the second and third electrodes 407, 412 and the acoustic coupling layer 411 do not span the cavity 402 in the representative embodiment. The fourth electrode 417, like the first electrode 403, extends over a first edge 421 of the cavity 402, but a termination edge 423 of the fourth electrode 417 does not reach a second edge 422 of the cavity 402. Thus, the fourth electrode 417 does not span the cavity 402 in the representative embodiment.

As can be appreciated, a "dead" CRF region comprises an overlap, not over the cavity 402, of the first electrode 403, the first piezoelectric layer 406, the second electrode 407, the acoustic coupling layer 411, the third electrode 412, the second piezoelectric layer 416 and the fourth electrode 417. However, because the first, second, third and fourth planarization layers 404, 408, 409 and 410 extend over respective first and second edges 421, 422 of the cavity 402, there is no region where the first electrode 403, the first piezoelectric layer 406, the second electrode 407, the acoustic coupling layer 411, the third electrode 412, the second piezoelectric layer 416 and the fourth electrode 417 overlap one another, but do not overlap the cavity 402. As such, in the depicted embodiment, there is no "dead" CRF region on a first connection side 424 (connections to first and fourth electrodes 403, 417), and no "dead" CRF region on a second connection side 425 (connections to the second and third electrodes 407, 412). As should be appreciated by one skilled in the art, connecting edges for first, second, third and fourth electrodes 403, 407, 412 and 417 of CRF 400 can be each connected to a different edge of a pentagon showed in FIG. 2A, depending on a biasing scheme for a specific implementation of CRF 400. Alternatively, some connecting edges can be connected to the same edge of the pentagon, while the remaining electrodes can be connected to different other edges of the pentagon shape shown in FIG. 2A. Nevertheless, the principle of avoiding the "dead CRF" regions by using the first, second, third and fourth planarization layers 404, 408, 409 and 410 and placing the termination edges 405, 413, 414, 415 and 423 inside the cavity 402 is the same as described in connection with CRF 400 and shown in FIG. 4 and will not be repeated here for a brevity of a presentation.

While it is useful for the termination edge 405 of the first electrode 403, and/or the termination edge 413 of the second electrode 407, and/or the termination edge 415 of the third electrode 412, and or the termination edge 423 of the fourth electrode 417 to occur over the cavity 402 as described above, this is not essential. Rather, one or more of the first, second, third and fourth electrodes 403, 407, 412 and 417 can span the cavity 402, and respective termination edges 405, 413, 414, 415 and 423 are located over the substrate 401 in respective first and second connection sides 424, 425.

Regardless of the location of the respective termination edges 405, 413, 414, 415 and 423, the first, second, third and fourth planarization layers 404, 408, 409 and 410 each provide a substantially planar layer stack and the benefits thereof. Notably, along the first and second connection sides 424, 425, each layer is substantially planar. As such, acoustic losses to scattering are reduced because impedance discontinuities that result from the "sloped" contour in known devices (e.g., as depicted in FIG. 1) are substantially eliminated. Additionally, the first, second, third and fourth planarization layers 404, 408, 409 and 410 beneficially improve the quality of growth of subsequent layers (e.g., highly textured c-axis piezoelectric material) and simplify their processing.

Finally, the location of the respective termination edges 405, 413, 414, 415 and 423 are selected to provide the first, second, third and fourth electrodes 403, 407, 412 and 417, and the acoustic coupling layer 411 with a particular length to further improve desired reflections of acoustic energy "back" to the active region 418, and thereby improve the performance of the CRF 400 by reducing acoustic losses to undesired modes that are supported by CRF 400.

In another representative embodiment, one or more of the first, second, third fourth electrodes 403, 407, 412 span the cavity 402, and respective termination edges 405, 413, 415 and 423 are located over the substrate 401 in respective first and second connection sides 424, 425. In such an embodiment, the first and fourth electrodes 403, 417 could extend past the second edge 422 of the cavity 402 and the respective termination edges 413, 415 could be located over the substrate 401 in the second connection side 425. Similarly, the second and third electrodes 407, 412 could extend past the first edge 421 of the cavity 402, and the respective termination edges 413, 415 could be located over the substrate 401 in the first connection side 424.

After forming the cavity 402 in the substrate 401, a sacrificial material (not shown) is provided in the cavity 402. The first electrode 403 is formed over the substrate 401 by a known method. The first electrode 403 extends only partially across the sacrificial material. The first planarization layer 404 is then provided over the substrate 401. The deposition of the first planarization layer 404 also results in planarization material being deposited over the first electrode 403. A known planarization method (e.g., (CMP)) is used to remove the planarization material from the upper surface of the first electrode 403, and so the first planarization layer 404 is substantially "flush" with the first electrode 403. After the planarization step is completed, the first piezoelectric layer 406 and the second electrode 407 are formed using known methods and materials. The second planarization layer 408 is then provided over the first piezoelectric layer 406. The deposition of the second planarization layer 408 also results in planarization material being deposited over the second electrode 407. A known planarization method (e.g., (CMP) is used to remove the planarization material from the upper surface of the second electrode 407, and so the second planarization layer 408 is substantially "flush" with the second electrode 407. The acoustic coupling layer 411 is formed using known methods and materials. The third planarization layer 409 is then provided over the second electrode 407. The deposition of the third planarization layer 409 also results in planarization material being deposited over the acoustic coupling layer 411. A known planarization method (e.g., (CMP)) is used to remove the planarization material from the upper surface of the acoustic coupling layer 411, and so the third planarization layer 409 is substantially "flush" with the acoustic coupling layer 411. After the planarization step is completed, the third electrode 412 is formed using known methods and materials. The fourth planarization layer 410 is then provided over the acoustic coupling layer 411. The deposition of the fourth planarization layer 410 also results planarization material being deposited over the third electrode 412. A known planarization method (e.g., (CMP)) is used to remove the planarization material from the upper surface of the third electrode 412, and so the fourth planarization layer 410 is substantially "flush" with the third electrode 412.

The second piezoelectric layer 416 and the fourth electrode 417 are fabricated over the second piezoelectric layer 416 using known methods and materials. After the layer structure of the CRF 400 is completed, the sacrificial layer is removed and the cavity 402 is revealed.

In a representative embodiment, after the planarization step is effected, the first planarization layer 404 has a thickness (y-direction of the coordinate system of FIG. 4) that is substantially the same as the thickness of the first electrode 403. As such, the first planarization layer 404 is substantially flush with the first electrode 403. Similarly, after the second planarization step, the second planarization layer 408 has a thickness (y-direction of the coordinate system of FIG. 4) that is substantially the same as the thickness of the second electrode 407. As such, the second planarization layer 408 is substantially flush with the second electrode 407. After the third planarization step, the third planarization layer 409 has a thickness (y-direction of the coordinate system of FIG. 4) that is substantially the same as the thickness of the acoustic coupling layer 411. As such, the third planarization layer 409 is substantially flush with the acoustic coupling layer 411. Finally, after the fourth planarization step, the fourth planarization layer 410 has a thickness (y-direction of the coordinate system of FIG. 4) that is substantially the same as the thickness of the third electrode 412. As such, the fourth planarization layer 410 is substantially flush with the third electrode 412. As noted above, the first, second, third and fourth planarization layers 404, 408, 409 and 410 each comprise a suitable material that will not be removed or altered in any subsequent processing (e.g., removal of the sacrificial material from the cavity 402) after planarization is completed. Illustratively, the planarization layer 410 comprises a glass material such as non-etchable borosilicate glass (NEBSG).

In accordance with illustrative embodiments, BAW resonators comprising a non-piezoelectric layer and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator, comprising:
    a cavity disposed in a substrate;
    a first electrode disposed over the cavity;
    a planarization layer disposed adjacent to but not over the first electrode, an edge of the planarization layer abutting an edge of the first electrode, the cavity having an edge and the planarization layer extending over the edge of the cavity and abutting a termination edge of the first electrode, and the first electrode terminating before the edge of the cavity at a distance equal to an odd integer multiple of one-quarter wavelength ($\lambda/4$) of a complex thickness-extensional eigenmode that exists outside an active region of the BAW resonator, wherein an upper surface of the planarization layer and an upper surface of the first electrode are substantially flush, and the termination edge is disposed at an angle relative to a surface of the substrate and the planarization layer has a termination edge disposed at a supplementary angle to the angle;
    a piezoelectric layer disposed over the first electrode and the planarization layer; and
    a second electrode disposed over the piezoelectric layer.

2. A BAW resonator as claimed in claim 1, wherein the planarization layer comprises non-etchable borosilicate glass (NEBSG).

3. A bulk acoustic wave (BAW) resonator, comprising:
    a cavity disposed in a substrate;
    a first electrode disposed over the cavity, the cavity having cavity edge and the first electrode extends over the edge of the cavity and onto a surface of the substrate, wherein the first electrode extends a distance over the substrate;
    a planarization layer disposed adjacent to the first electrode;
    a piezoelectric layer disposed over the first electrode; and
    a second electrode disposed over the piezoelectric layer, wherein the distance is equal to or smaller than a quarter wavelength of a first propagating eigenmode in an active region of the BAW resonator.

4. A BAW resonator as claimed in claim 3, wherein the first electrode has a termination edge that is disposed at an angle relative to the surface of the substrate and the planarization layer has a termination edge disposed at a supplementary angle to the angle.

5. A bulk acoustic wave (BAW) resonator, comprising:
    a cavity disposed in a substrate;

a first electrode disposed over the cavity, the first electrode terminating at a distance before the edge of the cavity, wherein the distance is equal to an odd integer multiple of one-quarter wavelength (λ/4) of a complex thickness-extensional eigenmode that exists outside an active region the BAW resonator;
   a planarization layer disposed adjacent to but not over the first electrode, an edge of the planarization layer abutting an edge of the first electrode;
   a piezoelectric layer disposed over the first electrode and the planarization layer; and
   a second electrode disposed over the piezoelectric layer, wherein the cavity has an edge and the planarization layer extends over the edge of the cavity and abuts a termination edge of the first electrode.

6. A BAW resonator as claimed in claim 5, wherein the planarization layer comprises non-etchable borosilicate glass (NEBSG).

7. A BAW resonator as claimed in claim 6, wherein the termination edge is disposed at an angle relative to a surface of the substrate, and the planarization layer has a termination edge disposed at a supplementary angle to the angle.

8. A bulk acoustic wave (BAW) resonator, comprising:
   a cavity disposed in a substrate;
   a first electrode disposed over the cavity;
   a first planarization layer disposed adjacent to the first electrode, an edge of the first planarization layer abutting an edge of the first electrode;
   a first piezoelectric layer disposed over the first electrode;
   a second electrode disposed over the first piezoelectric layer;
   a second planarization layer disposed adjacent to the second electrode;
   a second piezoelectric layer disposed over the second electrode; and
   a third electrode disposed over the second piezoelectric layer.

9. A BAW resonator as claimed in claim 8, wherein the cavity has an edge and the first planarization layer extends over the edge of the cavity and abuts a termination edge of the first electrode.

10. A BAW resonator as claimed in claim 9, wherein the termination edge of the first electrode is disposed at an angle relative to a surface of the substrate and the first planarization layer has a termination edge disposed at a supplementary angle to the angle.

11. A BAW resonator as claimed in claim 9, wherein the first electrode terminates at a distance before the edge of the cavity.

12. A BAW resonator as claimed in claim 11, wherein the distance is equal to an odd integer multiple of one-quarter wavelength of a fundamental thickness-extensional complex eigenmode in the acoustic stack comprising a distance region of a BAW resonator.

13. A BAW resonator as claimed in claim 11, further comprising: an acoustic coupling layer disposed between the second electrode and the second piezoelectric layer; a third planarization layer adjacent to the coupling layer; a fourth electrode disposed above the acoustic coupling layer and beneath the second piezoelectric layer; and a fourth planarization layer adjacent to the fourth electrode.

14. A BAW resonator as claimed in claim 8, wherein the planarization layer comprises non-etchable borosilicate glass (NEBSG).

15. A BAW resonator as claimed in claim 8, wherein the cavity has a cavity edge and the first electrode extends over the edge of the cavity and onto a surface of the substrate.

16. A BAW resonator as claimed in claim 8, wherein the second planarization layer is disposed between the first piezoelectric layer and the second piezoelectric layer, and abuts a termination edge of the second electrode.

* * * * *